(12) United States Patent
Kouzuma

(10) Patent No.: US 6,456,132 B1
(45) Date of Patent: Sep. 24, 2002

(54) PHASE-LOCKED LOOP CIRCUIT

(75) Inventor: Shinichi Kouzuma, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/527,444

(22) Filed: Mar. 17, 2000

(30) Foreign Application Priority Data

Jul. 13, 1999 (JP) ............................................ 11-199310

(51) Int. Cl.⁷ ................................................. H03L 7/06
(52) U.S. Cl. ........................ 327/159; 327/160; 327/117; 327/162; 375/376; 331/DIG. 2
(58) Field of Search ................................ 327/141, 142, 327/146–151, 155–157, 159, 160, 115, 117, 162; 375/373–376; 331/1 A, 18, 25, DIG. 2; 365/233, 233.5

(56) References Cited

U.S. PATENT DOCUMENTS

| | | | | |
|---|---|---|---|---|
| 5,304,954 A | * | 4/1994 | Saito et al. | 331/1 A |
| 5,389,897 A | * | 2/1995 | Gebara | 331/1 |
| 6,066,988 A | * | 5/2000 | Igura | 331/18 |

* cited by examiner

*Primary Examiner*—Timothy P. Callahan
*Assistant Examiner*—Minh Nguyen

(57) ABSTRACT

A phase-locked loop circuit having a frequency dividing circuit which is reset in response to a reset signal. The reset signal is generated by a first frequency divided signal generated by dividing the frequency of a reference clock signal and an output signal from a voltage controlled oscillator. The phase-locked loop circuit adjusts rapidly the frequency and the phase of the output signal of the voltage controlled oscillator to correspond to that of the reference clock signal.

11 Claims, 13 Drawing Sheets

PHASE-LOCKED LOOP CIRCUIT

BACKGROUND OF THE INVENTION

1. Field of the Invention

The present invention relates to a phase-locked loop (PLL) circuit. In particular, the present invention relates to a PLL circuit frequency synthesizer circuit.

2. Description of the Related Art

The conventional PLL circuit comprises a phase comparator, a low-pass filter, a voltage controlled oscillator, and a 1/N frequency divider. The 1/N frequency divider is comprised of at least one counter. The 1/N frequency divider is a circuit which divides a clock signal fvco output from the voltage controlled oscillator, and outputs a signal fp with 1/N times the frequency of the clock signal fvco. The phase comparator is a circuit that compares a phase of a reference clock signal and a phase of the clock signal fp, output from the frequency divider, and outputs a signal based on the result of the comparison. The low-pass filter is a circuit that removes high frequency noise output from the phase comparator. The voltage controlled oscillator outputs the clock signal fvco having a frequency related to the output voltage output from the low-pass filter.

The conventional 1/N frequency divider only divides the frequency of the clock signal fvco output from the voltage controlled oscillator. The 1/N frequency divider counts the pulse of the clock signal N times, from the time at which the clock signal fp falls. The 1/N frequency divider then lowers the clock signal fp. The voltage controlled oscillator outputs a higher frequency of the clock signal fvco responding to the phase difference between the clock signal fp and the reference clock signal, if the fall of the clock signal fp is delayed compared to the fall of the reference clock signal.

Here, if the fall of the clock signal fp output from the 1/N frequency divider is delayed compared to the fall of the reference clock signal, the 1/N frequency divider does not count the pulse of the clock signal fvco from the time of the fall of the reference clock signal. Instead, the 1/N frequency divider counts the pulse of the clock signal fvco from the time of the fall of the clock signal fp, which is later than the fall of the reference clock signal. The 1/N frequency divider then lowers the clock signal fp again. Next, the frequency of the clock signal fvco is newly determined, based on the difference of the time of the subsequent fall of the clock signal fp and the subsequent fall of the reference clock signal.

Here, the subsequent fall of the clock signal fp is related to the previous fall of the clock signal fp. Because the clock signal fp falls again after counting the pulse of the clock signal fvco N times from the time of the previous fall of the clock signal fp, the subsequent fall of the clock signal fp is related to the previous fall of the clock signal fp.

Furthermore, the clock signal fvco, which is generated based on the subsequent fall of the reference clock signal and the subsequent fall of the clock signal fp, is also related to the previous fall of the clock signal fp.

Therefore, if the previous fall of the clock signal is delayed more than the previous fall of the reference clock signal, the clock signal falls again. This fall occurs after the clock signal fvco is counted N times from the previous fall of the clock signal fp, and not from the previous fall of the reference clock signal. Thus, the subsequent fall of the reference clock signal and the subsequent fall of the clock signal fp do not match without using a clock signal fvco having an extremely high frequency. Therefore, there is a problem because it takes time to match both the frequency and phase of the reference clock signal and the clock signal fp.

SUMMARY OF THE INVENTION

Therefore, it is an object of the present invention to provide a phase-locked loop circuit which overcomes the above issues in the related art.

The phase-locked loop circuit of the present invention may have: a phase comparator which compares a phase of a first frequency divided signal, generated by dividing a frequency of a reference clock signal and a phase of a second frequency divided signal, which is an output signal of a frequency dividing circuit, and outputs a signal related to the comparison; a low-pass filter which outputs a voltage related to an output signal of the phase comparator; a voltage controlled oscillator which outputs a signal having a frequency related to a voltage output from the low-pass filter; and a frequency dividing circuit which outputs a first level of the second frequency divided signal related to a reset signal generated based on the first frequency divided signal and the output signal output from the voltage controlled oscillator, and outputs a second level of the second frequency divided signal when a number of pulses of the output signal of the voltage controlled oscillator reaches a prescribed number after inputting the reset signal.

This summary of the invention does not necessarily describe all necessary features. The invention may also be a sub-combination of these described features.

DETAILED DESCRIPTION OF THE INVENTION

The invention will now be described based on the preferred embodiments. This does not intend to limit the scope of the present invention, but exemplify the invention. All of the features and the combinations thereof described in the embodiments are not necessarily essential to the invention.

Figure 1:
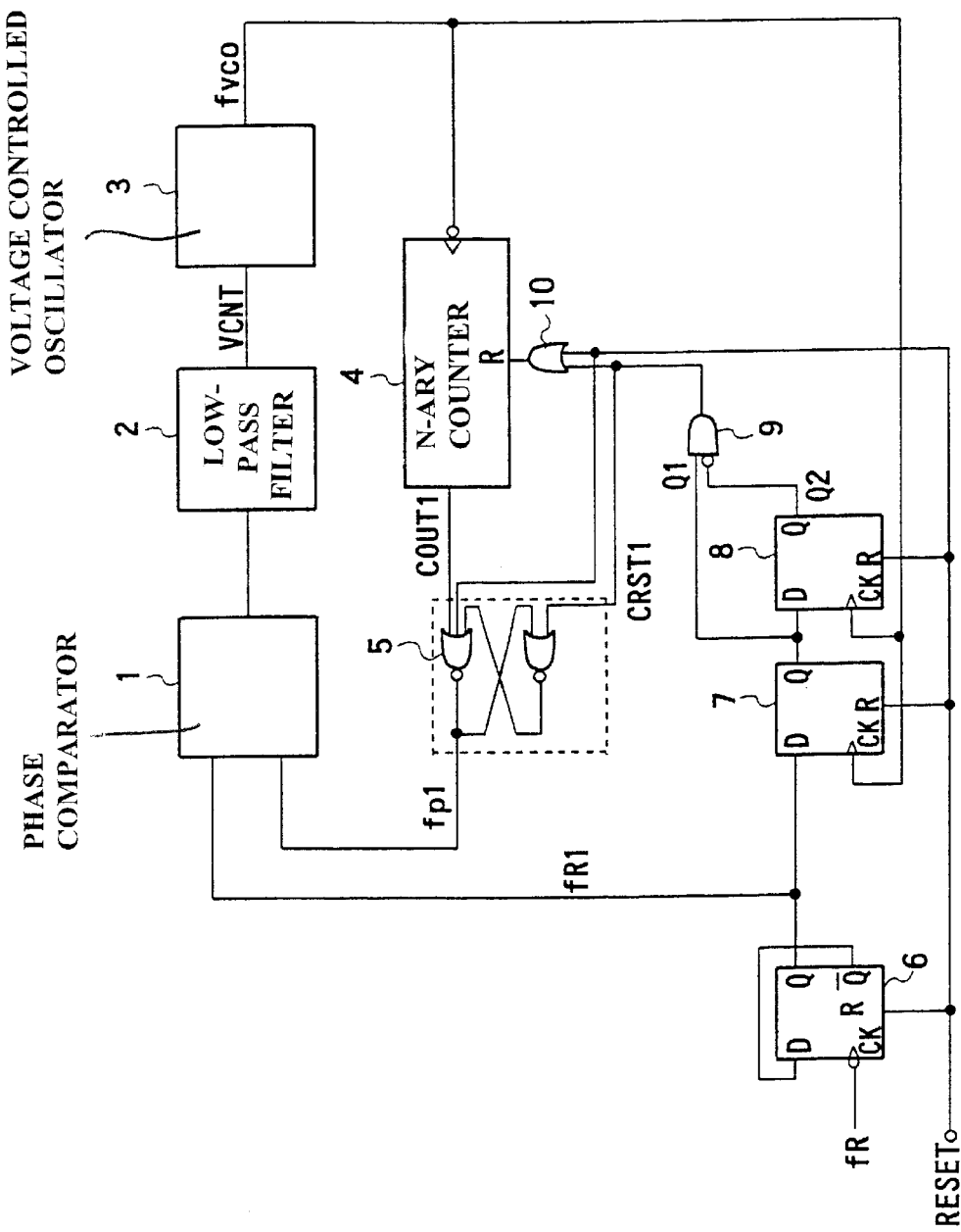
FIG. 1 shows the circuit diagram of a PLL circuit of the first embodiment of the present invention.

FIG. 1 shows a circuit diagram of a PLL circuit of the first embodiment of the present invention. The PLL circuit has a phase comparator 1, a low-pass filter 2, a voltage controlled oscillator 3, a N-ary counter 4, an RS latch circuit 5, latch circuits 6, 7, and 8, a gate circuit 9, and an OR circuit 10. The N-ary counter 4 and the RS latch circuit 5 comprise a frequency dividing circuit. The latch circuit 6 is comprised of a flip-flop circuit and an inverter. The latch circuit 7 is comprised of a flip-flop circuit. The latch circuit 8 is also comprised of a flip-flop circuit. The latch circuits 6, 7 and 8, the gate circuit 9 and the OR circuit 10 comprise a reset signal circuit.

An input pin D is connected to an output pin Q of the latch circuit 6. A reference clock signal fR is provided to the clock input pin of the latch circuit 6. The reset input pin of the latch circuit 6 is connected to a reset terminal, and a reset signal is provided to the reset input pin of the latch circuit 6. The latch circuit 6 is a circuit that divided the frequency of the reference clock signal fR and outputs the signal fR1 which has half the frequency of the reference clock signal fR.

The phase comparator 1 is a circuit that compares the phase of the signal fR1 and the phase of a signal fp1, which is an output signal of the RS latch circuit 5, and outputs a signal that is related to the result of the comparison. The low-pass filter 2 is a circuit that removes the high-frequency noise of the phase comparator 1. The voltage controlled oscillator 3 is a circuit that outputs a signal fvco having a frequency related to the output voltage output from the low-pass filter 2. The input pin D of the latch circuit 7 is connected to the output pin Q of the latch circuit 6. The signal fR1 is provided from the latch circuit 6 to the latch circuit 7. The clock input pin of the latch circuit 7 is connected to the output terminal of the voltage controlled oscillator 3, and the signal fvco is provided from the voltage controlled oscillator 3 to the latch circuit 7. The reset input pin of the latch circuit 7 is connected to the reset terminal, and the reset signal is provided to the latch circuit 7. The latch circuit 7 stores the signal fR1 at the rise of the signal fvco and outputs a signal Q1.

The input pin D of the latch circuit 8 is connected to the output pin Q of the latch circuit 7, and the signal Q1 is provided from the latch circuit 7 to the latch circuit 8. The clock input pin of the latch circuit 8 is connected to the output terminal of the voltage controlled oscillator 3. The signal fvco is provided from the voltage controlled oscillator 3 to the latch circuit 8. The reset input pin of the latch circuit 8 is connected to the reset terminal, and the reset signal is provided from the reset terminal to the latch circuit 8. The latch circuit 8 stores the signal Q1 at the rise of the signal fvco and outputs a signal Q2.

The gate circuit 9 comprises an AND gate and an inverter. The gate circuit 9 is a circuit that outputs the signal CRST1 which is a result of the AND operation of the signal, which inverts the signal Q2, and the signal Q1. The OR circuit 10 inputs the signal CRST1 and the reset signal RESET, and outputs a signal which is a result of the OR operation on the signal CRST1 and the signal RESET. The reset terminal R of the N-ary counter 4 is connected to the output of the OR circuit 10. The signal CRST1 or the reset signal RESET is input to the reset terminal R of the N-ary counter 4 through the OR circuit 10. The N-ary counter 4 counts the pulses of the signal fvco. The N-ary counter 4 is reset in response to a rise in the signal CRST1 or a rise in the reset signal RESET. The N-ary counter 4 outputs the high level signal COUT1 when the pulses of the signal fvco has been counted N times after the reset of the N-ary counter.

The reset input pin of the RS latch circuit 5 is connected to the output of the N-ary counter 4 and the reset terminal, and the signal COUT1 or the reset signal RESET is provided to the RS latch circuit 5. The set input pin of the RS latch circuit 5 is connected to the output of the gate circuit 9, and the signal CRST1 is provided to the set input pin of the RS latch circuit 5. The RS latch circuit 5 outputs a high level signal fp1 in response to a rise in the signal CRST1 and outputs a low level signal fp1 in response to a rise in the signal COUT1. The RS latch circuit 5 also outputs a low level signal fp1 in response to a rise in the reset signal RESET.

Figure 2:
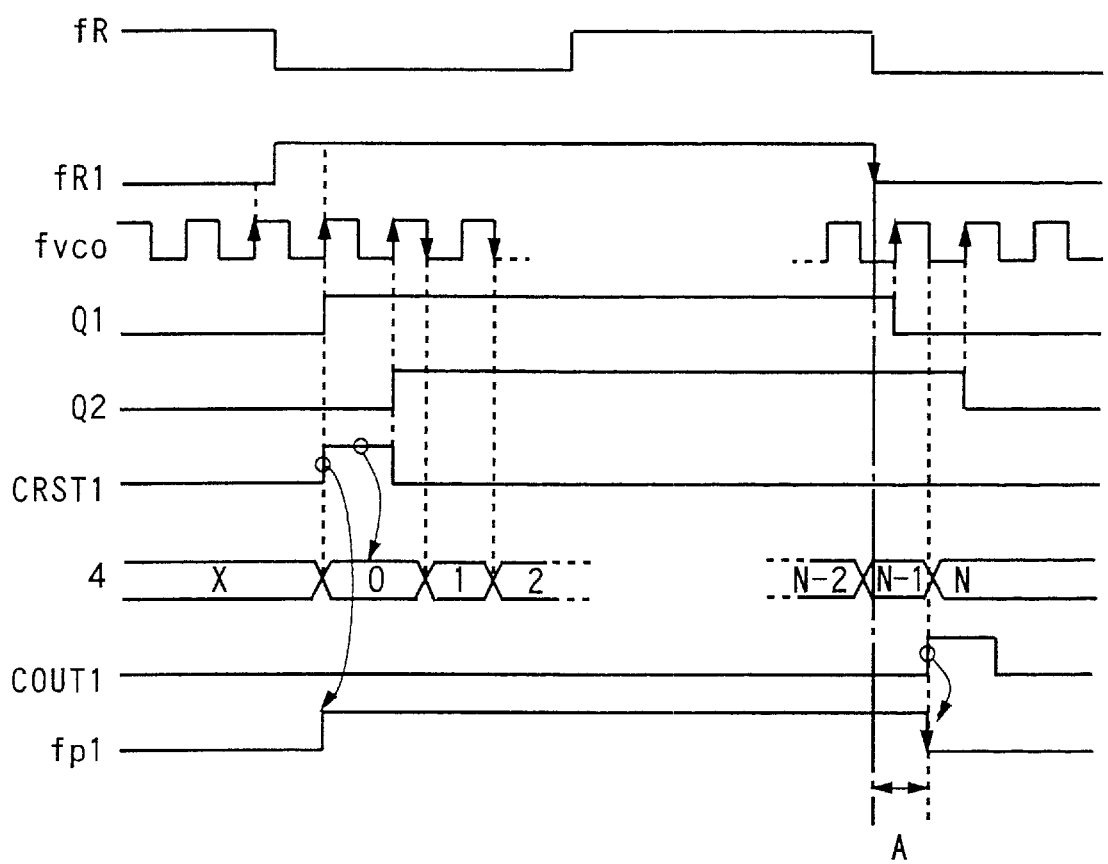
FIG. 2 shows a timing chart of the first embodiment of the present invention.

FIG. 2 shows the timing chart of the first embodiment of the present invention. The operation of the first embodiment will be explained with reference to FIG. 2. The reference clock signal fR of a prescribed frequency is input to the latch circuit 6. The high level reset signal RESET, not shown in the figure, is input for a prescribed time to the reset input pins of the latch circuits 6, 7, and 8, the reset terminal R of the n-ary counter 4 and the reset input pin of the RS latch circuit 5. The signal fR1, signal Q1, signal Q2, signal COUT1, and signal fp1 are thus set at a low level.

The latch circuit 6 then divides the frequency of the reference clock signal fR, and outputs a high level signal fR1 at the fall of the reference clock signal fR.

The latch circuit 7 stores the high level signal fR1 at the rise of the signal fvco output from the voltage controlled oscillator 3, and outputs the high level signal Q1. The latch circuit 8 stores the high level signal Q1 at the subsequent rise of the signal fvco, and outputs the high level signal Q2. The gate circuit 9 outputs the signal CRST1, which becomes a high level signal in response to a rise in the signal Q1, and becomes a low level signal in response to a rise in the signal Q2. The RS latch circuit 5 outputs the high level signal fp1 in response to the high level signal CRST1. Furthermore, the N-ary counter 4 is reset in response to the high level signal CRST1. The N-ary counter 4 outputs the high level signal COUT1 for a prescribed time when the pulse of the signal fvco is counted N times, after the resetting of the N-ary counter 4. The RS latch circuit 5 outputs the low level signal fp1 in response to a rise in the signal COUT1.

The phase comparator 1 compares the phase difference between the fall of the signal fR1 and the fall of the signal fp1 as shown by the phase difference A. The phase comparator 1 then outputs a signal in response to the result of the comparison. The low-pass filter 2 outputs a signal VCNT in response to the output of the phase comparator 1. The voltage controlled oscillator 3 outputs the signal fvco with the frequency related to the output voltage of the low-pass filter 2. The voltage controlled oscillator 3 increases the frequency of the signal fvco if the signal fp1 is delayed compared to the signal fR1.

The frequency of the signal fvco stabilizes at approximately N cycles of the reference clock signal fR by repeating the above operation every time the signal fR1 rises, that is, once per two falls of the signal fR.

According to the first embodiment, the N-ary counter 4 is reset in response to a rise of the signal fvco, output from the voltage controlled oscillator 3, and a rise of the signal fR1, input to the phase comparator 1. The N-ary counter 4 is reset at a rise of the signal fvco after a rise of the signal fR1. The N-ary counter 4 then raises the signal fp1 and counts the pulse of the signal fvco N times following this raise. The N-ary counter 4 then re-lowers the signal fp1.

Therefore, the PLL circuit of the first embodiment has an advantage of increasing the speed of adjustment of the frequency of the signal fvco. This is possible because the N-ary counter 4 of the present embodiment raises the signal fp1 in response to a rise of the signal fR1, independently of the fall of the signal fp1. Contrary to this, the conventional PLL circuit uses an N-ary counter which lowers the signal when the signal fvco is counted N times after the first fall of the signal output by the N-ary counter itself.

Furthermore, according to the first embodiment, the frequency of the signal fvco does not vary significantly because the N-ary counter 4 is reset in response to the rise of the signal fR1. Therefore, there is an advantage due to greater tolerance of unevenness of performance of each product of the low-pass filter. There is also a further advantage because the circuit, which detects the locking of the PLL circuit, can be easily constructed.

Figure 3:
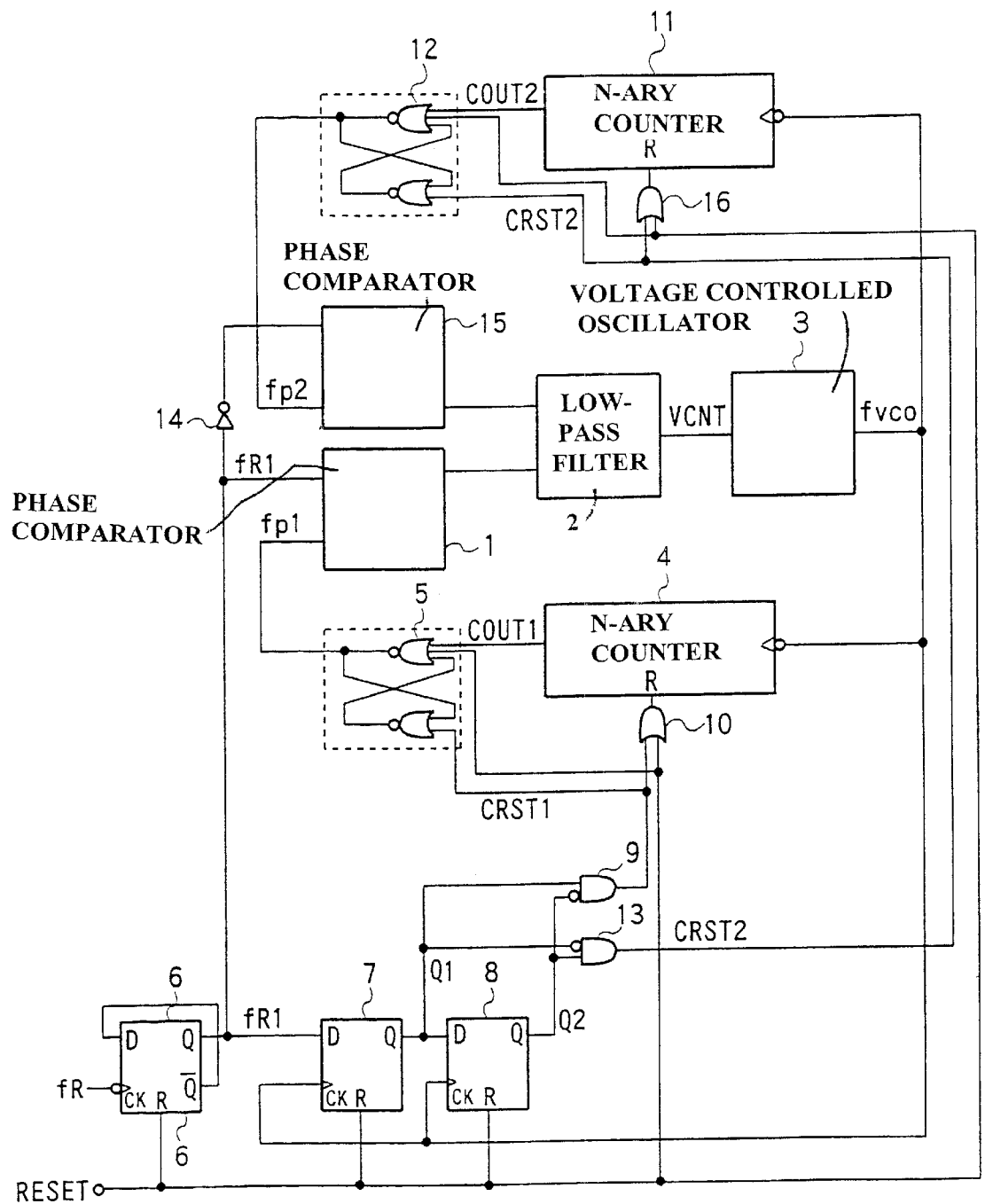
FIG. 3 shows a circuit diagram of a PLL circuit of the second embodiment of the present invention.

FIG. 3 shows the circuit diagram of the PLL circuit of the second embodiment of the present invention. The same codes are used for the element of the second embodiment which are the same as that of the first embodiment, and correspond to that of the first embodiment. Compared to the first embodiment, the second embodiment has an additional phase comparator 15, an N-ary counter 11, an RS latch circuit 12, a gate circuit 13, an inverter 14, and an OR circuit 16. The N-ary counter 11 and the RS latch circuit 12 comprise a second frequency dividing circuit.

The gate circuit 13 comprises an AND gate and an inverter. The gate circuit 13 is a circuit that outputs the signal CRST2 which is a result of the AND operation of the signal, which inverts the signal Q1, and passes the signal Q2 without inversion. The OR circuit 16 inputs the signal CRST2 and the reset signal RESET, and outputs a signal which is a result of the OR operation on the signal CRST2 and the reset signal RESET. The reset input pin R of the N-ary counter 11 is connected to the output of the OR circuit 16. The signal CRST2 or the reset signal RESET is input to the reset iput pin of the N-ary counter 11 through the OR circuit 16. The signal fvco is input to the N-ary counter 11 from the voltage controlled oscillator 3 and counts the pulses of the signal fvco. The N-ary counter 11 is reset in response to the signal CRST2 or the reset signal RESET. The N-ary counter 11 outputs the high level signal COUT2 when the pulse of the signal fvco has been counted N times, after resetting the N-ary counter.

The reset input pin of the RS latch circuit 12 is connected to the output of the N-ary counter 11 and the reset terminal. The signal COUT2 or the reset signal RESET is provided to the RS latch circuit 12. The set input pins of the RS latch circuit 12 are connected to the output of the gate circuit 13, and the signal CRST2 is provided to the RS latch circuit 12. The RS latch circuit 12 outputs the high level signal fp2 in response to a rise of the signal CRST2, and outputs the low level signal fp2 in response to a rise of the signal COUT2 and a rise of the reset signal RESET.

The inverter 14 is connected to the output of the latch circuit 6. The inverter 14 outputs a signal that is an inversion of the signal fR1. The phase comparator 15 compares the phase of the output signal of the inverter 14 and the signal fp2, output from the RS latch circuit 12, and outputs a signal in response to the result of the comparison.

Figure 4:
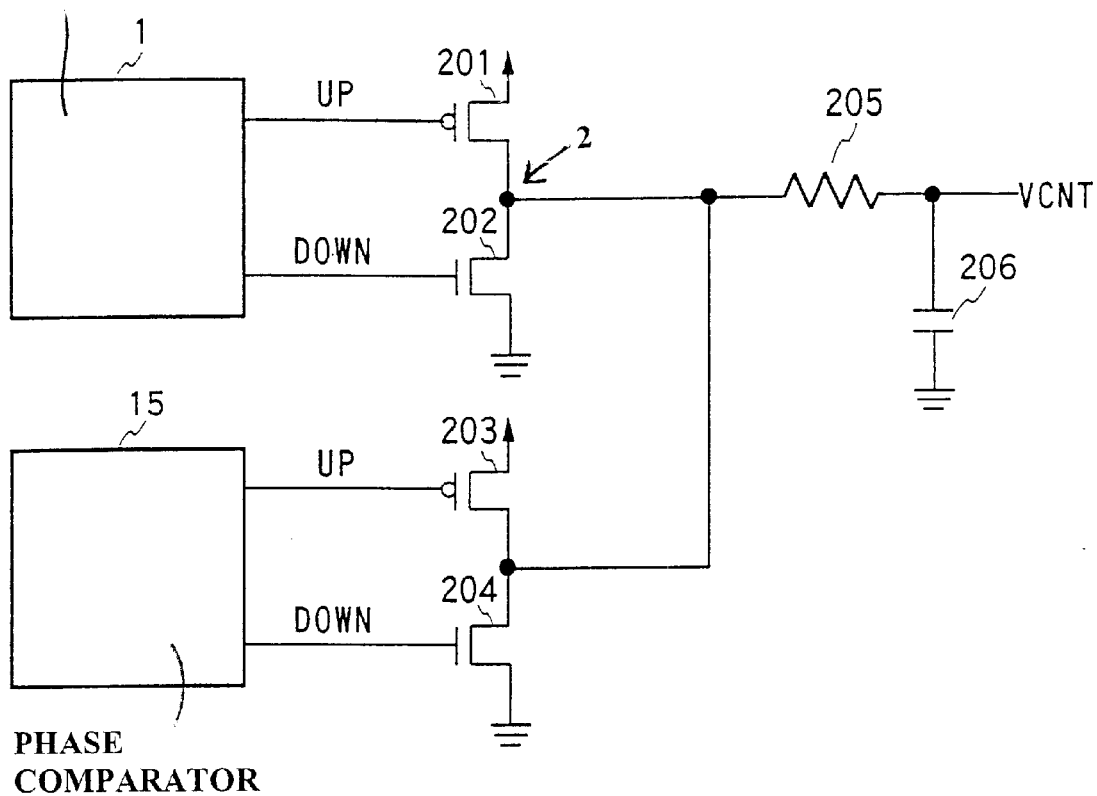
FIG. 4 shows a circuit diagram of a low-pass filter 2 of the second embodiment.

FIG. 4 shows the circuit diagram of the low-pass filter 2 of the second embodiment. The low-pass filter 2 has a PMOS 201, which responds to the UP signal output from the phase comparator 1, a NMOS 202, which responds to the DOWN signal output from the phase comparator 1, a PMOS 203, which responds to the UP signal output from the phase comparator 15, a NMOS 204, which responds to the DOWN signal output from the phase comparator 15, a resistor 205 and a condenser 206. The low-pass filter 2 of the first embodiment does not have the PMOS 203 and the NMOS 204.

Figure 5:
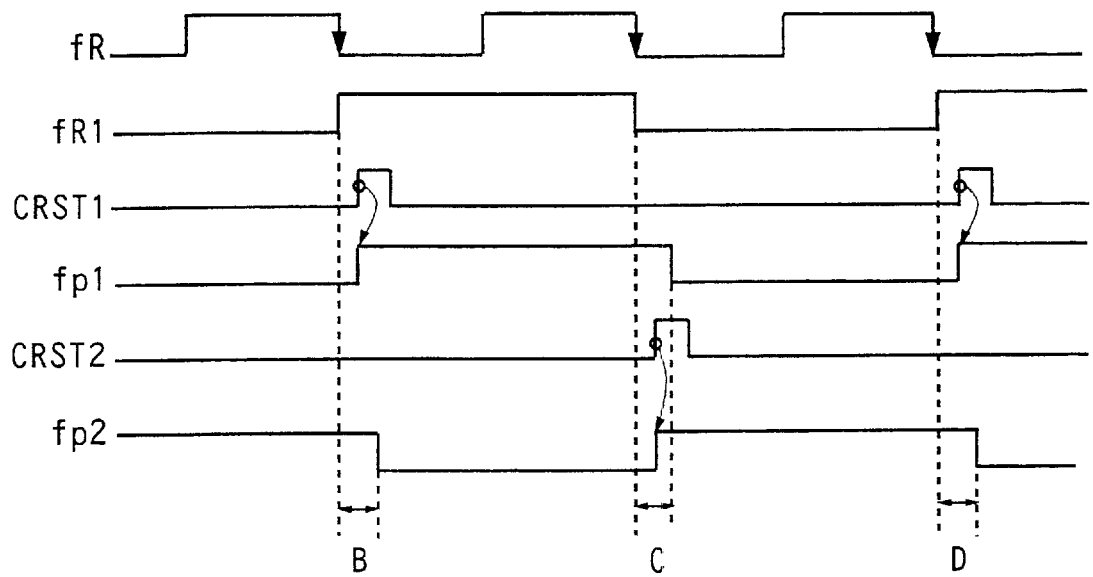
FIG. 5 shows a timing chart of the second embodiment of the present invention.

FIG. 5 shows the timing chart of the second embodiment of the present invention. The operation of the second embodiment will be explained with reference to FIG. 5. The reference clock signal fR of the prescribed frequency is input to the latch circuit 6. The high level reset signal RESET is input to each of the reset input pins of the latch circuits 6, 7, and 8, the N-ary counters 4 and 11, and each of the reset inputs pins of the RS latch circuits 5 and 12. The signal fR1, signal Q1, signal Q2, signal COUT1, signal COUT2, signal fp1, and signal fp2 are thus set at a low level.

The latch circuit 6 divides the frequency of the reference clock signal fR. The gate circuit 9 outputs the signal CRST1 when the signal fvco rises after the rise of the signal fR1, in the same way as the first embodiment. The RS latch circuit 5 outputs the signal fp1 in response to the signal CRST1. The signal fp1 remains at a high level until the signal COUT1 rises.

The phase comparator 1 compares the phase of the signal fR1 and the signal fp1 as shown in the phase difference C. The phase comparator 1 then outputs a signal in response to the phase difference. The low-pass filter 2 outputs a voltage in response to the output of the phase comparator 1. The voltage controlled oscillator 3 outputs the signal fvco with a frequency related to the output voltage of the low-pass filter 2.

The latch circuit 7 then stores the low level signal fR1 at the rise of the signal fvco output from the voltage controlled oscillator 3, and outputs the low level signal Q1. The latch circuit 8 stores the low level signal Q1 at the subsequent rise of the signal fvco, and outputs the low level signal Q2. The gate circuit 13 outputs the signal CRST2, which becomes a high level signal in response to the rise of the signal Q1, and becomes a low level signal in response to the fall of the signal Q2. The RS latch circuit 12 outputs the high level signal fp2 in response to the high level signal CRST2.

The N-ary counter 11 is reset in response to the high level signal CRST2. The N-ary counter 11 outputs the high level signal COUT2 for a prescribed time when the pulse of the signal fvco is counted N times, after the resetting of the N-ary counter 11. The RS latch circuit 12 outputs the low level signal fp2 in response to a rise of the signal COUT2.

The phase comparator 15 compares the phase difference of the fall of the output signal of the inverter 14, which is an inversion of the signal fR1, and the fall of the signal fp2, as shown in the phase difference B and D. The phase comparator 15 then outputs a signal in response to the result of the comparison. The low-pass filter 2 outputs a signal in response to the output of the phase comparator 15. The voltage controlled oscillator 3 outputs the signal fvco with a frequency responding to the output of the low-pass filter 2. The voltage controlled oscillator 3 increases the frequency of the signal fvco if the output signal of the inverter 14 is delayed compared to the signal fR2.

The low-pass filter 2 of the second embodiment outputs a signal in response to the output of the phase comparator 1 and the phase comparator 15. The voltage controlled oscillator 3 outputs the signal fvco with a frequency related to the output of the low-pass filter 2. The voltage controlled oscillator 3 increases the frequency of the signal fvco if the signal fR1 is delayed compared to the signal fp1, and if the output signal of the inverter 14 is delayed compared to the signal fp2.

According to the second embodiment, the frequency of the signal fvco stabilizes at approximately N cycles of the reference clock signal fR by repeating the above phase difference comparison every time the signal fR1 rises or falls, that is, every time the signal fR falls.

Because the second embodiment compares the phase difference every time the reference clock signal fR falls, the time for stabilizing the frequency is shorter than that of the first embodiment.

Figure 6:
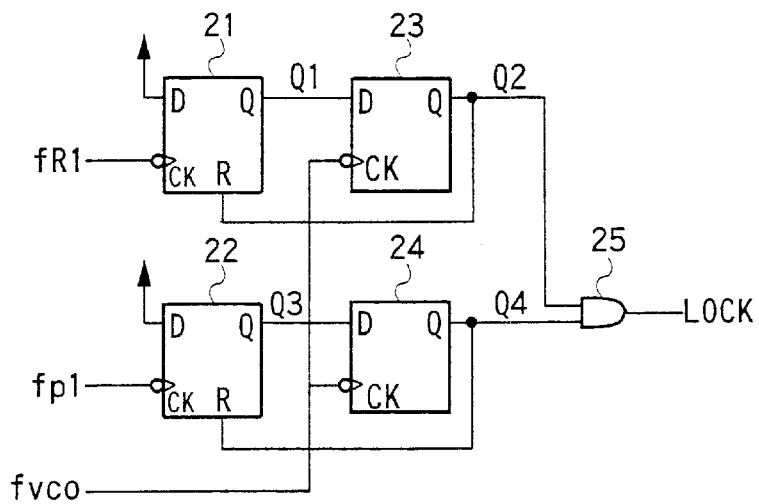
FIG. 6 shows a circuit diagram of a lock detecting circuit of the third embodiment of the present invention.

FIG. 6 shows the circuit diagram of the lock detecting circuit of the third embodiment of the present invention. The lock detecting circuit of the third embodiment comprises a latch circuit 21, a latch circuit 22, a latch circuit 23, a latch circuit 24, and an AND circuit 25.

The latch circuit 21 comprises a flip-flop circuit and an inverter. The latch circuit 22 also comprises a flip-flop circuit and an inverter. It follows that the latch circuit 23 also comprises a flip-flop circuit and an inverter. The latch circuit 24 is comprised of one flip-flop circuit.

A high level electric potential is provided to an input pin D of the latch circuit 21. The signal fR1 is provided to a clock input pin of the latch circuit 21. The output signal Q2, which is output from the latch circuit 23, is provided to the reset input pin of the latch circuit 21. The latch circuit 21 outputs the high level signal Q1 in response to the fall of the signal fR1, and outputs the low level signal Q1 in response to the input of the high level signal Q2.

The output of the latch circuit 21 is connected to an input pin D of the latch circuit 23, and the signal Q1 is provided to the latch circuit 23. The signal fvco is provided to a clock input pin of the latch circuit 23. The latch circuit 23 stores the signal Q1 in response to the fall of the signal fvco, and outputs the signal Q2.

A high level electric potential is provided to an input pin D of the latch circuit 22. The signal fp1 is provided to a clock input pin of the latch circuit 22. The reset input pin of the latch circuit 22 is connected to the output of the latch circuit 24. The output signal Q4 is provided to the reset input pin of the latch circuit 22. The latch circuit 22 outputs the high level signal Q3 in response to the fall of the signal fp1, and outputs the low level signal Q3 in response to the input of the high level signal Q4.

The output of the latch circuit 22 is connected to an input pin D of the latch circuit 24, and the signal Q3 is provided to the latch circuit 24. The signal fvco is provided to a clock input pin of the latch circuit 24. The latch circuit 24 stores the signal Q3 in response to the rise of the signal fvco, and outputs the signal Q4.

The AND circuit 25 outputs the signal LOCK, which is a result of the AND operation on the signal Q2 and the signal Q4.

Figure 7:
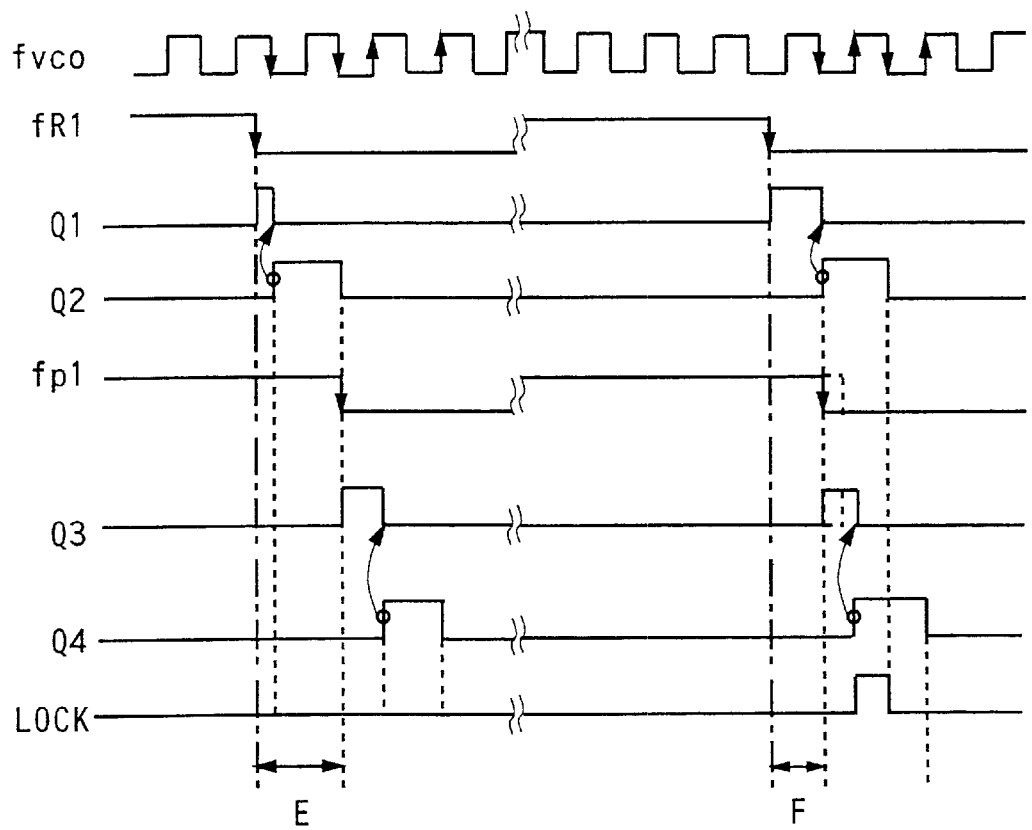
FIG. 7 shows a timing chart of a lock detecting circuit of the third embodiment.

FIG. 7 shows the timing chart of the lock detecting circuit of the third embodiment. The operation of the third embodiment will be explained with reference to FIG. 7.

The latch circuit 21 outputs the high level signal Q1 in response to the fall of the signal fR1. The flip-flop circuit 23 stores the high level signal Q1 responding to the fall of the signal fvco, and outputs the high level signal Q2. The latch circuit 21 is reset in response to the output of the signal Q2, and the latch circuit 21 outputs the low level signal Q1. The latch circuit 23 stores the low level signal Q1 in response to the fall of the signal fvco, and outputs the low level signal Q2.

The latch circuit 22 outputs the high level signal Q3 responding to the low level signal fp1. The latch circuit 24 outputs the high level signal Q4 responding to the rise of the signal fvco. The latch circuit 22 is reset responding to the output of the signal Q4, and the latch circuit 22 outputs the low level signal Q3. The latch circuit 24 stores the low level signal Q3 responding to the rise of the signal fvco and outputs the low level signal Q4.

If the high level signal Q2 and the high level signal Q4 are input to the AND circuit 25, the AND circuit 25 outputs the high level signal LOCK.

Considering that the signal fp1 and the signal fvco fall synchronously, the time at which the signal LOCK becomes high level is the time that the phase difference between the signal fr1 and the signal fp1 is within one clock cycle of the signal fvco, as shown by the phase difference F. If the phase difference between the signal fR1 and the signal fp1 is larger than one clock cycle of the signal fvco as shown in the phase difference E, the signal LOCK does not become high level.

Therefore, the signal LOCK is a signal showing that the frequency error of the signal fvco comes to within a 100/N percent.

The lock detecting circuit of the third embodiment is constructed to input the signal fR1, generated by dividing the frequency of the reference clock signal, and the signal fp1 output from the RS latch circuit. There will therefore be no problems where the frequency of the signal fvco does not match with the target frequency, and the phase of the signal fp1 and the signal fR1 matches only by chance. Therefore, the lock detecting circuit of the third embodiment has an advantage in that the lock detecting circuit can detect that the PLL circuit is locked accurately so that the frequency error of the signal fvco is within a range of 100/N percent.

In the third embodiment, the high level signal LOCK output by the AND circuit becomes the signal to indicate that the PLL circuit is locked accurately so that the frequency error is within a range of 200/N percent or 300/N percent. This is achieved by dividing the frequency of the signal fvco and providing to the latch circuits 23 and 24 a signal with a frequency twice or triple the frequency of the signal fvco.

Figure 8:
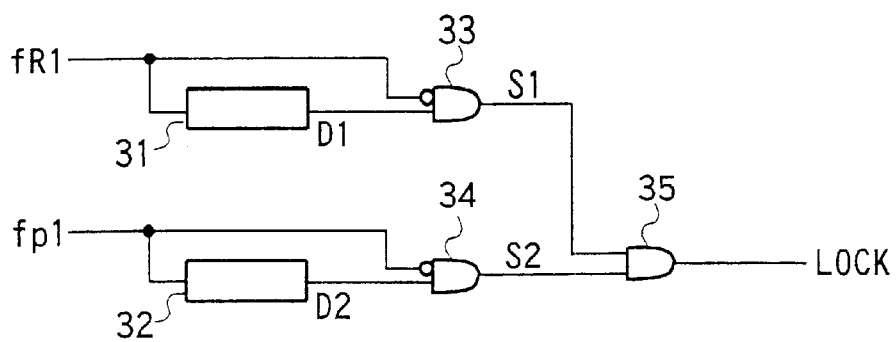
FIG. 8 shows a circuit diagram of a lock detecting circuit of the fourth embodiment of the present invention.

FIG. 8 shows the circuit diagram of the lock detecting circuit of the fourth embodiment of the present invention. The lock detecting circuit of the fourth embodiment comprises a delay circuit 31, a delay circuit 32, gate circuits 33 and 34, and an AND circuit 35.

The delay circuit 31 is the circuit that outputs the signal fR1 after delaying the signal fR1 for a prescribed time. The delay circuit 32 also outputs the signal fp1 after delaying the signal fp1 for a prescribed time. The gate circuit 33 is comprised of an AND gate and an inverter. The gate circuit 33 outputs the signal S1, which is a result of the AND operation of the inversion of the signal fR1 and a signal D1 output from the delay circuit 31. The gate circuit 34 is comprised of an AND gate and an inverter. The gate circuit 34 outputs the signal S2 which is a result of the AND operation of the inversion of the signal fp1 and a signal D2 output from the delay circuit 32. The AND circuit 35 outputs the signal which is a result of the AND operation on a signal S1 and a signal S2.

Figure 9:
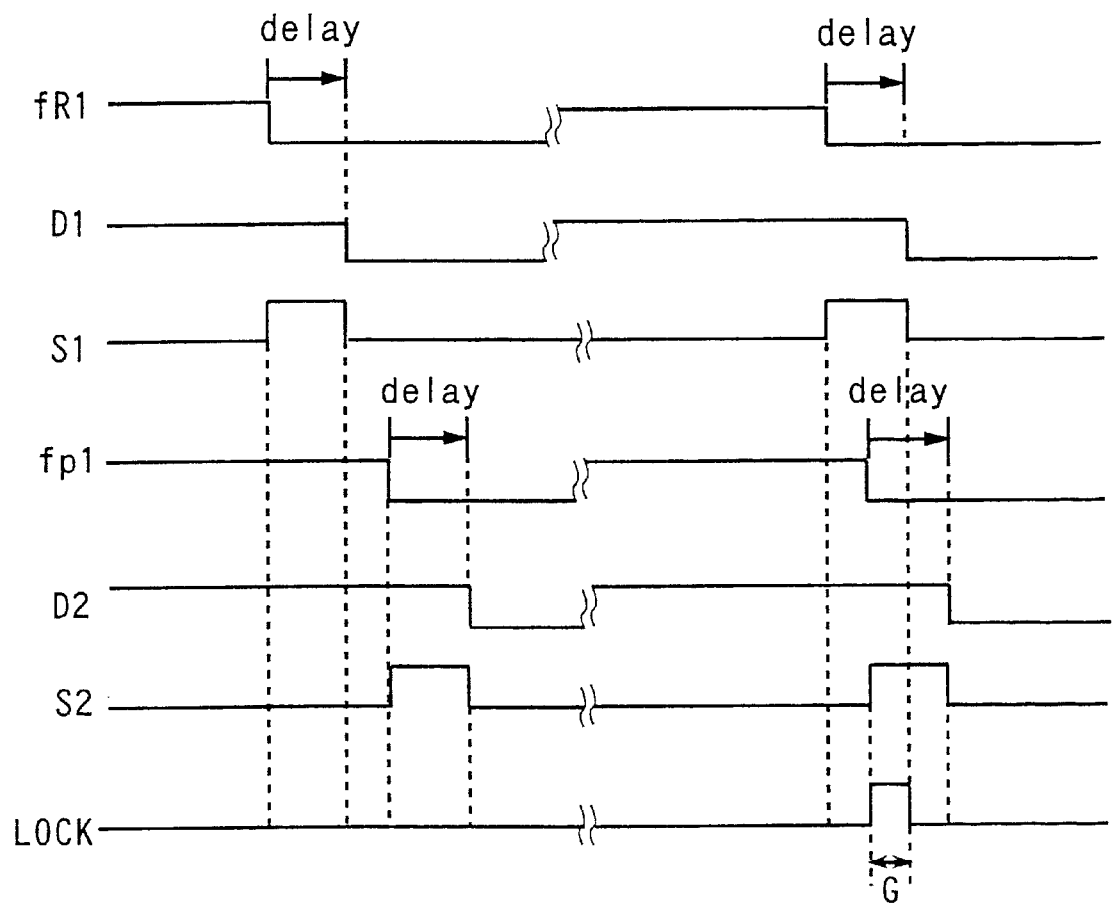
FIG. 9 shows a timing chart of a lock detecting circuit of the fourth embodiment.

FIG. 9 shows the timing chart of the lock detecting circuit of the fourth embodiment. The operation of the fourth embodiment will be explained with reference to FIG. 9.

The gate circuit 33 outputs the high level signal S1 when the signal fR1 falls. The delay circuit 31 outputs the low level signal D1 following the elapse of a prescribed time after the fall of the signal fR1. The gate circuit 33 outputs the low level signal S1 in response to the low level signal D1. The gate circuit 34 outputs the high level signal S2 when the signal fp1 falls. The delay circuit 32 outputs the low level signal D2 after the prescribed time has elapsed since the fall of the signal fp1. The gate circuit 34 outputs the low level signal S2 in response to the low level signal D2. The AND circuit 35 outputs the high level signal LOCK when the high level signal S1 and the high level signal S2 are input to the AND circuit 35 as shown by the time period G in FIG. 9.

According to the fourth embodiment, the frequency error of the signal fvco can be arbitrarily set by setting the delay time of the delay circuit arbitrarily.

Figure 10:
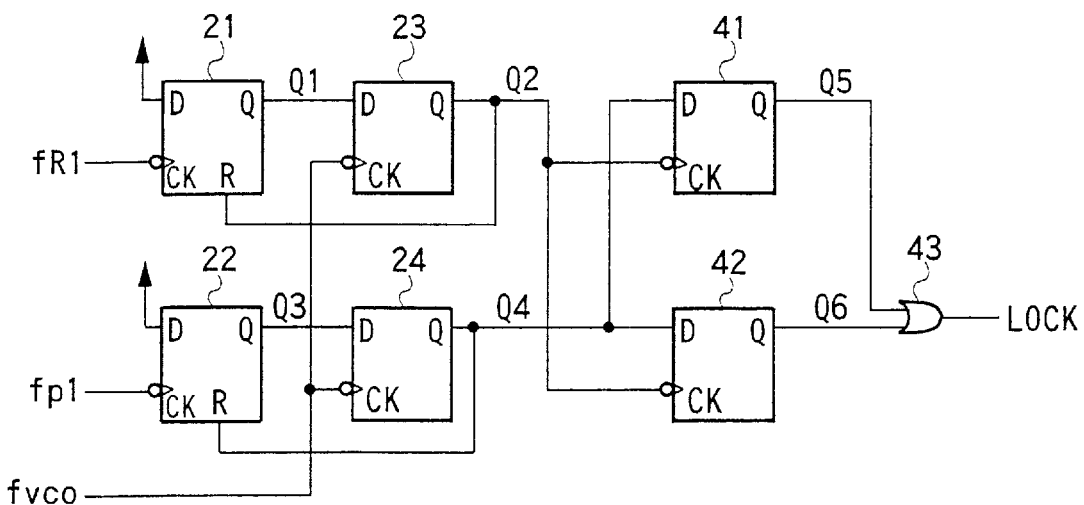
FIG. 10 shows a circuit diagram of a lock detecting circuit of the fifth embodiment of the present invention.

FIG. 10 shows the circuit diagram of the lock detecting circuit of the fifth embodiment of the present invention. The same codes are used for those elements of the fifth embodiment that are the same as those of the third embodiment, and correspond to the third embodiment. The explanation of the elements with the same code as the third embodiment will be omitted.

The lock detecting circuit of the fifth embodiment comprises a latch circuit 21, a latch circuit 22, a latch circuit 23, a latch circuit 24, a latch circuit 41, a latch circuit 42, and an OR circuit 43. The latch circuit 41 is comprised of a flip-flop circuit. The latch circuit 42 is comprised of a flip-flop circuit and an inverter.

The input pin D of the latch circuit 41 is connected to an output pin Q of the latch circuit 24, and the signal Q4 is provided to the latch circuit 41. The clock input pin of the latch circuit 41 is connected to the output pin Q of the latch circuit 23, and the signal Q2 is provided to the latch circuit 41. The latch circuit 41 outputs the signal Q5 by storing the signal Q4 in response to the rise of the signal Q2.

The input pin D of the latch circuit 42 is connected to an output pin Q of the latch circuit 24, and the signal Q4 is provided to the latch circuit 42. The clock input pin of the latch circuit 42 is connected to the output pin Q of the latch circuit 23, and the signal Q2 is provided to the latch circuit 42. The latch circuit 42 outputs the signal Q6 by storing the signal Q4 in response to the rise of the signal Q2.

The OR circuit 43 is connected to the output pin Q of the latch circuit 41 and the output pin Q of the latch circuit 42. The OR circuit 43 outputs the signal which is a result of the OR operation on the signal Q5 and the signal Q6.

Figure 11:
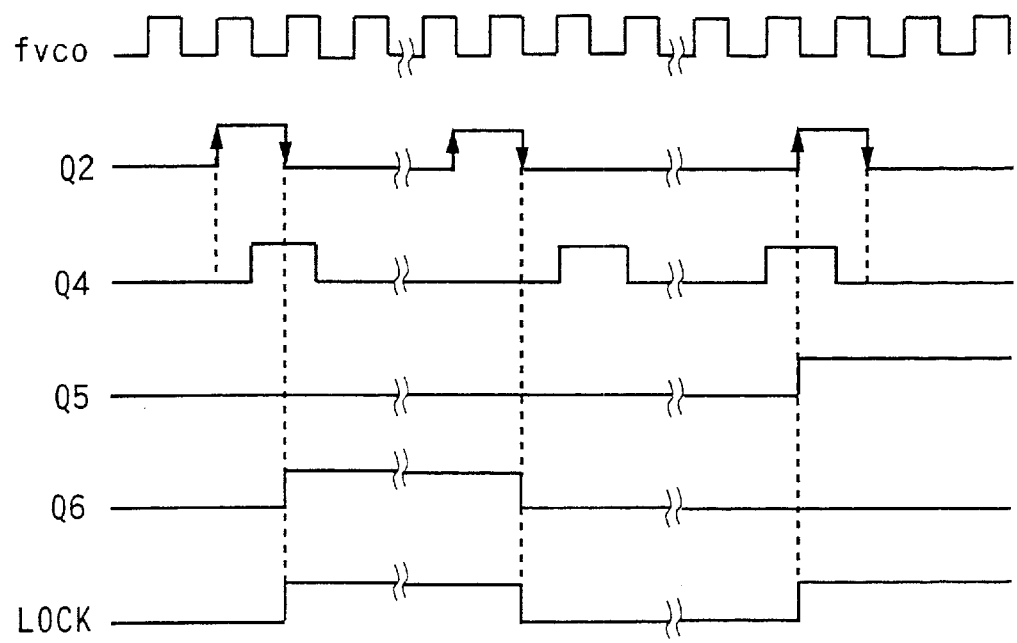
FIG. 11 shows a timing chart of a lock detecting circuit of the fifth embodiment.

FIG. 11 shows the timing chart of the lock detecting circuit of the fifth embodiment. The latch circuits 21, 22, 23, and 24 operate in the same way that the lock detecting circuit of the third embodiment operates.

In the lock detecting circuit of the fifth embodiment, the latch circuits 41 and 42 output the signal Q5 and Q6 after storing the signal Q4 in response to the respective rise and fall of the signal Q2. The OR circuit 43 outputs the signal LOCK which is a result of the OR operation on the output signal Q5 of the latch circuit 41 and the output signal Q6 of the latch circuit 42. The signal LOCK is high level when the frequency error of the signal fvco is within a range of 100/N percent. The signal LOCK is low level when the frequency error of the signal fvco exceeds the range of 100/N percent.

Therefore, detecting both the locking of the PLL circuit and the unlocking of the PLL circuit becomes possible in the fifth embodiment.

Figure 12:
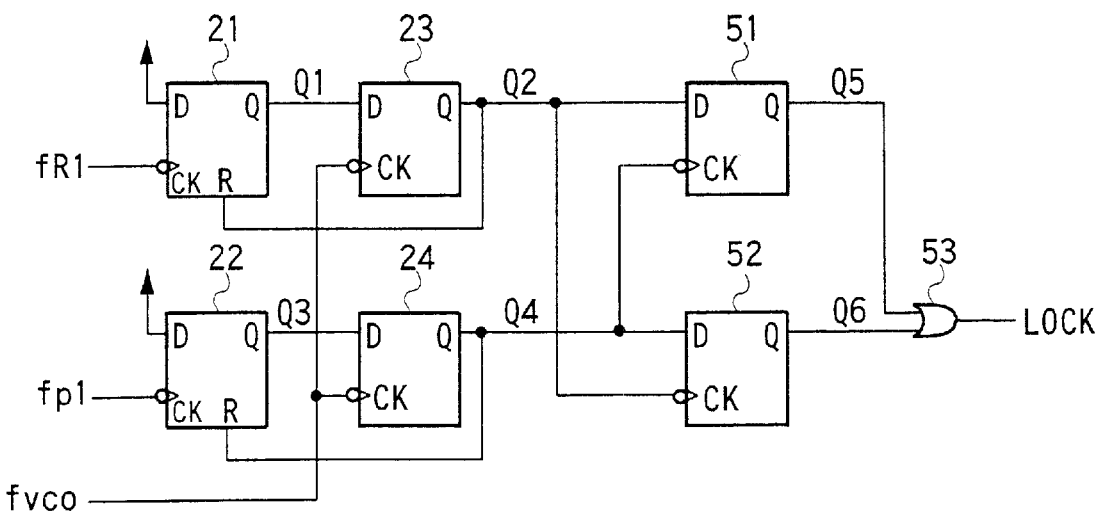
FIG. 12 shows a circuit diagram of a lock detecting circuit of the sixth embodiment of the present invention.

FIG. 12 shows the circuit diagram of the lock detecting circuit of the sixth embodiment of the present invention. The same codes are used for those elements of the fifth embodiment that are the same as those of the third embodiment, and correspond to that of the third embodiment. The explanation of the elements that have the same code as the third embodiment will be omitted.

The lock detecting circuit of the sixth embodiment comprises a latch circuit 21, a latch circuit 22, a latch circuit 23, a latch circuit 24, a latch circuit 51, a latch circuit 52, and an OR circuit 53. The latch circuit 51 is comprised of a flip-flop circuit and an inverter. The latch circuit 52 is also comprised of a flip-flop circuit and an inverter.

The input pin D of the latch circuit 51 is connected to an output pin Q of the latch circuit 23, and the signal Q2 is provided to the latch circuit 51. The clock input pin of the latch circuit 51 is connected to the output pin Q of the latch circuit 24, and the signal Q4 is provided to the latch circuit 51. The latch circuit 51 outputs the signal Q5 by storing the signal Q2 responding to the fall of the signal Q4.

The input pin D of the latch circuit 52 is connected to an output pin Q of the latch circuit 24, and the signal Q4 is provided to the latch circuit 52. The clock input pin of the latch circuit 52 is connected to the output pin Q of the latch circuit 23, and the signal Q2 is provided to the latch circuit 52. The latch circuit 52 outputs the signal Q6 by storing the signal Q4 responding to the fall of the signal Q2.

The OR circuit 53 is connected to the output pin Q of the latch circuit 51 and the output pin Q of the latch circuit 52. The signals Q5 and Q6 are provided to the OR circuit 53. The OR circuit 53 outputs the signal LOCK, which is a result of the OR operation on the signal Q5 and the signal Q6.

Figure 13:
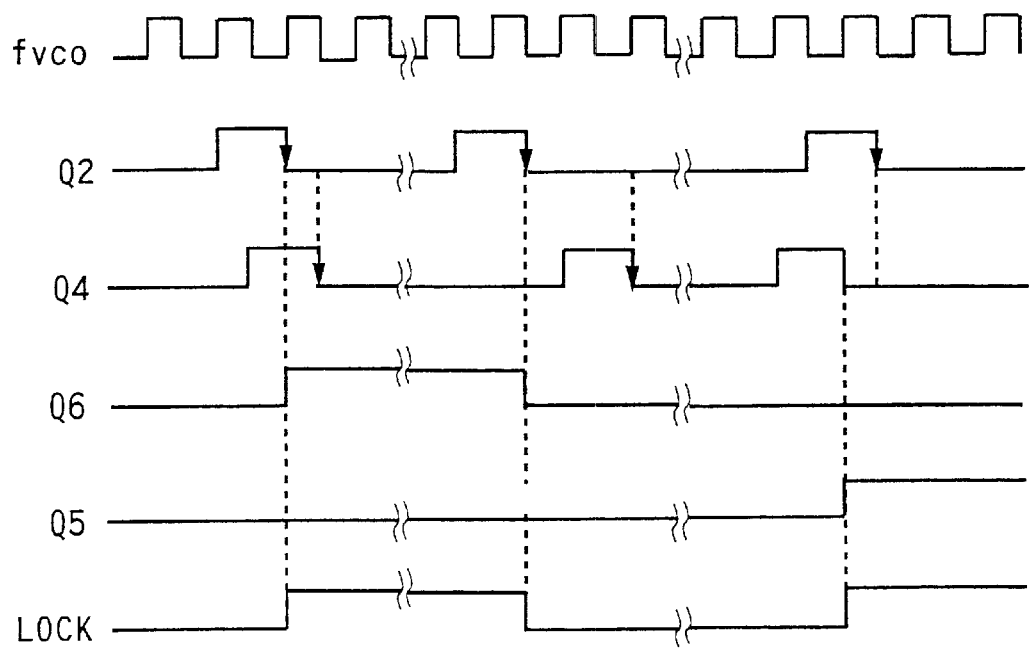
FIG. 13 shows a timing chart of a lock detecting circuit of the sixth embodiment.

FIG. 13 shows the timing chart of the lock detecting circuit of the sixth embodiment. The latch circuits 21, 22, 23, and 24 operate in the same way that the lock detecting circuit of the third embodiment operates.

The latch circuit 51 outputs the signal Q5 after storing the signal Q2 in response to the fall of the signal Q4. The latch circuit 52 outputs the signal Q6 after storing the signal Q4 responding to the fall of the signal Q2. The OR circuit 53 outputs the signal LOCK which is a result of the OR operation on the output signal Q5 of the latch circuit 51 and the output signal Q6 of the latch circuit 52. The signal LOCK is high level when the frequency error of the signal fvco is within the range of 100/N percent. The signal LOCK is low level when the frequency error of the signal fvco exceeds the range of 100/N percent.

Therefore, detecting both the locking of the PLL circuit and the unlocking of the PLL circuit becomes possible in the sixth embodiment.

Figure 14:
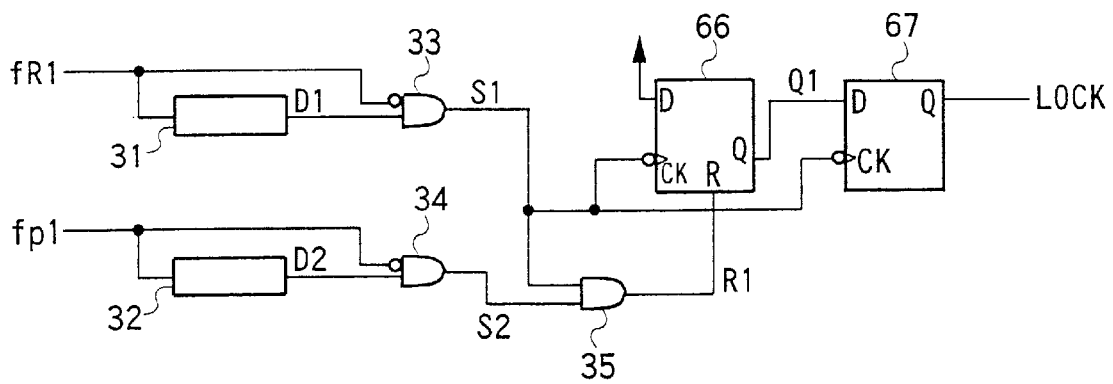
FIG. 14 shows a circuit diagram of a lock detecting circuit of the seventh embodiment of the present invention.

FIG. 14 shows the circuit diagram of the lock detecting circuit of the seventh embodiment of the present invention.

The lock detecting circuit of the seventh embodiment comprises a delay circuit 31, a delay circuit 32, a gate circuit 33 and 34, an AND circuit 35, a latch circuit 66 and a latch circuit 67.

The latch circuit 66 is comprised of a flip-flop circuit. The latch circuit 67 is comprised of a flip-flop circuit and an inverter. The delay circuit 31, the delay circuit 32, the gate circuit 33, the gate circuit 34 and the AND circuit have the same structure as those of the fourth embodiment.

The clock input pin of the latch circuit 66 is connected to the output of the gate circuit 33, and the signal S1 is provided to the latch circuit 66. A high level electric potential is applied to the input pin D of the latch circuit 66. The reset input pin of the latch circuit 66 is connected to the output of the AND circuit 35, and the signal R1 is provided to the latch circuit 66. The latch circuit 66 outputs the low level signal Q1 responding to the rise of the signal S1, and outputs the high level signal Q1 in response to the reset signal R1. The input in D of the latch circuit 67 is connected to the output pin Q of the latch circuit 66, and the signal Q1 is provided to the latch circuit 67. The clock input pin of the latch circuit 67 is connected to the output of the gate circuit 33, and the signal S1 is provided to the latch circuit 67. The latch circuit 67 outputs the signal LOCK by storing the signal Q1 responding to the fall of the signal S1.

Figure 15:
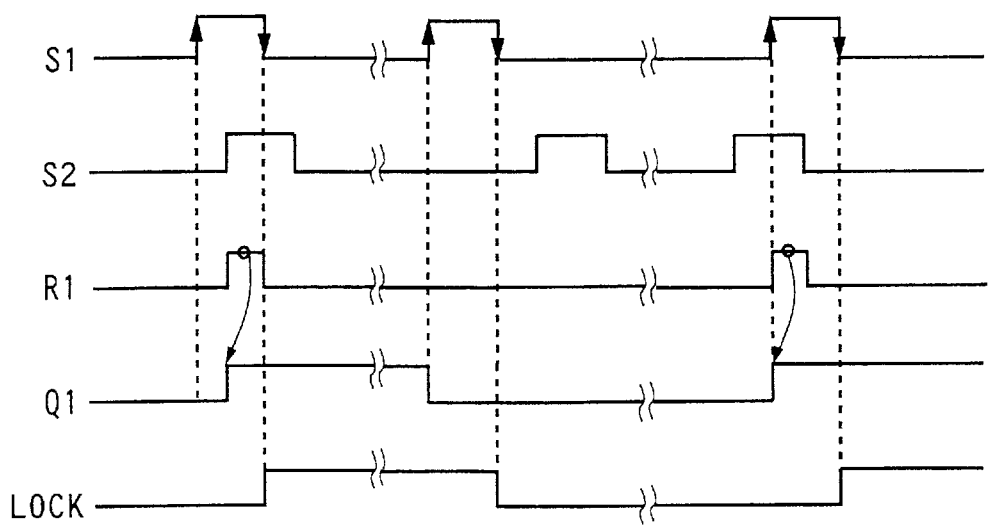
FIG. 15 shows a timing chart of a lock detecting circuit of the seventh embodiment.

FIG. 15 shows the timing chart of the lock detecting circuit of the seventh embodiment. The operation of the seventh embodiment will be explained with reference to FIG. 15.

As shown in FIG. 15, the latch circuit 66 outputs the low level signal Q1 in response to the rise of the signal S1. When the signal S1 and the signal S2 simultaneously become high level, the AND circuit 35 outputs the high level signal R1. The latch circuit 66 is reset in response to the high level signal R1, and the latch circuit 66 outputs the high level signal Q1.

Next, the latch circuit 67 stores the high level signal Q1 and outputs the high level signal LOCK when the signal S1 becomes low level. The latch circuit 66 then outputs the low level signal Q1 when the signal S1 becomes high level again. The latch circuit 66 continues to output the low level signal Q1 when the signal S1 and the signal S2 do not simultaneously become high level because the latch circuit 66 is not reset. The latch circuit 67 stores the low level signal Q1 in response to the fall of the signal S1 and outputs the low level signal LOCK.

The signal LOCK is high level when the frequency error is within a predetermined range, and the signal LOCK is low level when the frequency error exceeds a predetermined range. According to the seventh embodiment, the range of the frequency error can be arbitrarily set by the delay circuit. Therefore, detecting both the locking of the PLL circuit and the unlocking of the PLL circuit becomes possible as in the fifth embodiment.

Figure 16:
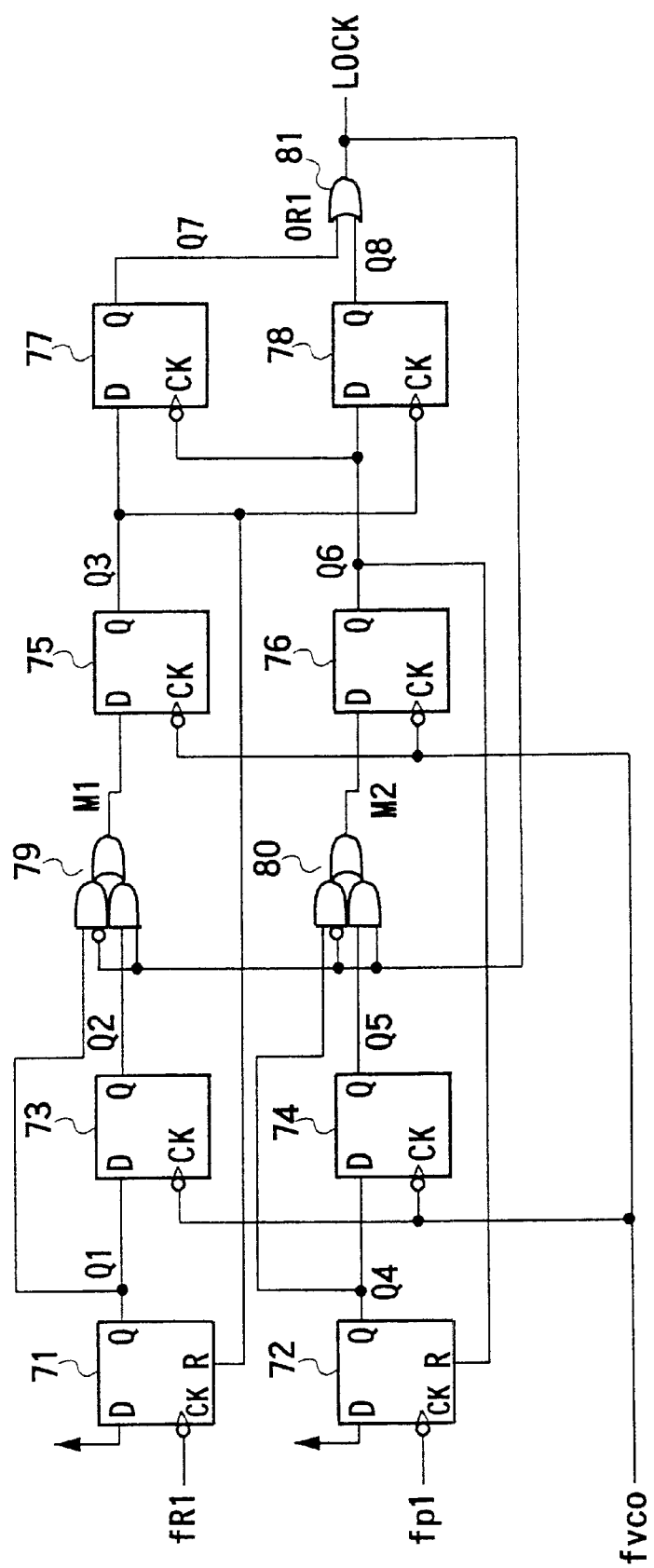
FIG. 16 shows a circuit diagram of a lock detecting circuit of the eighth embodiment of the present invention.

FIG. 16 shows the circuit diagram of the lock detecting circuit of the eighth embodiment of the present invention.

The lock detecting circuit of the eighth embodiment comprises a latch circuit 71, a latch circuit 72, a latch circuit 73, a latch circuit 74, a latch circuit 75, a latch circuit 76, a latch circuit 77, a latch circuit 78, a multiplexer 79, a multiplexer 80, and an OR circuit 81. The latch circuit 71 is comprised of a flip-flop circuit and an inverter. The latch circuit 72 is also comprised of a flip-flop circuit and an inverter. The latch circuit 73 is again comprised of a flip-flop circuit and an inverter. The latch circuit 74 is comprised of a flip-flop circuit. The latch circuit 75 is comprised of a flip-flop circuit and an inverter. The latch circuit 76 is comprised of a flip-flop circuit only. The latch circuit 77 is comprised of a flip-flop circuit and an inverter. The latch circuit 78 is also comprised of a flip-flop circuit and an inverter.

A high level electric potential is provided to the input pin D of the latch circuit 71. The signal fR1 is provided to the clock input pin of the latch circuit 71. The output signal Q3 output from the latch circuit 75 is provided to the reset input pin of the latch circuit 71. The latch circuit 71 outputs the high level signal Q1 in response to the fall of the signal fR1, and outputs the low level signal Q1 in response to the input of the high level signal Q3.

The input pin D of the latch circuit 73 is connected to an output of the latch circuit 71, and the signal Q1 is provided to the latch circuit 73. The signal fvco is provided to the clock input pin of the latch circuit 73. The latch circuit 73 stores the signal Q1 in response to the fall of the signal fvco, and outputs the signal Q2.

A high level electric potential is provided to the input pin D of the latch circuit 72. The signal fp1 is provided to the clock input pin of the latch circuit 72. The output signal Q6 output from the latch circuit 76 is provided to the reset input pin of the latch circuit 72. The latch circuit 72 outputs the high level signal Q4 in response to the fall of the signal fp1, and outputs the low level signal Q4 in response to the input of the high level signal Q6.

The input pin D of the latch circuit 74 is connected to an output of the latch circuit 72, and the signal Q4 is provided to the latch circuit 74. The signal fvco is provided to the clock input pin of the latch circuit 74. The latch circuit 74 stores the signal Q4 in response to the rise of the signal fvco and outputs the signal Q5.

The multiplexer circuit 79 comprises an inverter which is provided with a signal LOCK, a first AND gate which is provided with an inverter's output signal and the signal Q1, a second AND gate which is provided with the signal Q2 and the signal LOCK, and an OR gate which is connected to the first AND gate and the second AND gate.

The multiplexer circuit 80 comprises an inverter which is provided with a signal LOCK, a first AND gate which is provided with an inverter's output signal and the signal Q4, a second AND gate which is provided with the signal Q5 and the signal LOCK, and an OR gate which is connected to the first AND gate and the second AND gate.

The signal M1 output from the multiplexer circuit 79 is provided to the input pin D of the latch circuit 75. The signal fvco is provided to the clock input pin of the latch circuit 75. The latch circuit 75 stores the signal M1 in response to the fall of the signal fvco and outputs the signal Q3. The latch circuit 76 stores the signal M2 in response to the rise of the signal fvco, and outputs the signal Q6.

The input pin D of the latch circuit 77 is connected to the output of the latch circuit 75, and the signal Q3 is provided to the latch circuit 77. The clock input pin of the latch circuit 77 is connected to the output of the latch circuit 76, and the signal Q6 is provided to the latch circuit 77. The latch circuit 77 stores the signal Q3 in response to the fall of the signal Q6 and outputs the signal Q7.

The input pin D of the latch circuit 78 is connected to the output of the latch circuit 76, and the signal Q6 is provided to the latch circuit 78. The clock input pin of the latch circuit 78 is connected to the output of the latch circuit 75, and the signal Q3 is provided to the latch circuit 78. The latch circuit 78 stores the signal Q6 in response to the fall of the signal Q3 and outputs the signal Q8.

The OR circuit 81 is connected to the output of the latch circuit 77 and the output of the latch circuit 78. The signals Q7 and Q8 are provided to the OR circuit 81. The OR circuit 81 outputs the signal LOCK which is a result of the OR operation on the signal Q7 and the signal Q8.

Figure 17:
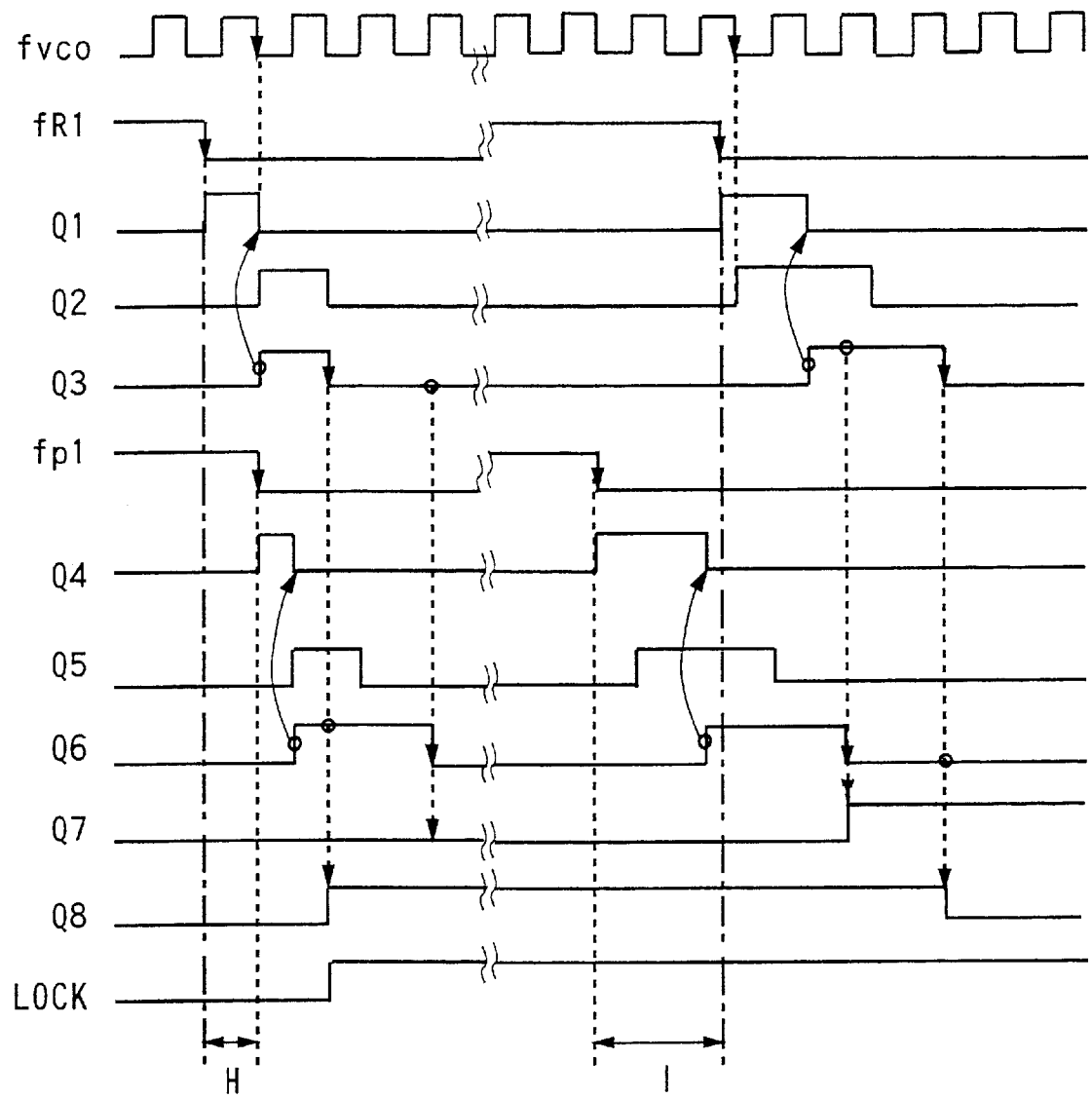
FIG. 17 shows a timing chart of a lock detecting circuit of the eighth embodiment.

FIG. 17 shows the timing chart of the lock detecting circuit of the eighth embodiment. The operation of the eight embodiment will be explained with reference to FIG. 17.

As shown in FIG. 17, the latch circuit 71 outputs the high level signal Q1 when the signal fR1 falls. At this time, the multiplexer circuit 79 selects and outputs the signal Q1 when the signal LOCK is low level. The latch circuit 75 stores the high level signal Q1 at the fall of the signal fvco and outputs the high level signal Q3. The latch circuit 71 is reset in response to the high level signal Q3, and the latch circuit 71 outputs the low level signal Q1. The latch circuit 75 outputs the low level signal Q3 at the subsequent fall of the signal fvco. In this way, the high level signal Q3 is generated, with a width of one cycle of the signal fvco.

The latch circuit 72 outputs the high level signal Q4 when the signal fp1 falls. At this time, the multiplexer circuit 80 selects and outputs the signal Q4 when the signal LOCK is low level. The latch circuit 74 stores the high level signal Q4 at the rise of the signal fvco and outputs the signal Q5. The latch circuit 76 stores the high level signal Q4 at the rise of the signal fvco and outputs the high level signal Q6. The latch circuit 72 is reset in response to the high level signal Q6, and the latch circuit 72 outputs the low level signal Q4. The latch circuit 74 stores the low level signal Q4 at the fall of the signal fvco and outputs the low level signal Q5. At this time, the latch circuit 76 stores the low level signal Q5 at the subsequent rise of the signal fvco and outputs the signal Q6 because the low level signal LOCK is input to the multiplexer circuit 80. In this way, a high level signal Q6 is generated, having twice the cycle width of the signal fvco.

If the signal Q3 or the signal Q6 becomes high level because of the fall of the signal Q3 or signal Q6, the signal Q7 or the signal Q8, which are output signals of the latch circuit 77 and the latch circuit 78 respectively, becomes high level, and the signal LOCK thus becomes high level. In this way, when it is judged that the phase difference between the signal fR1 and the signal fp1 is within the range of one cycle of the signal fvco, the signal LOCK becomes high level as shown in the phase difference H.

Figure 18:
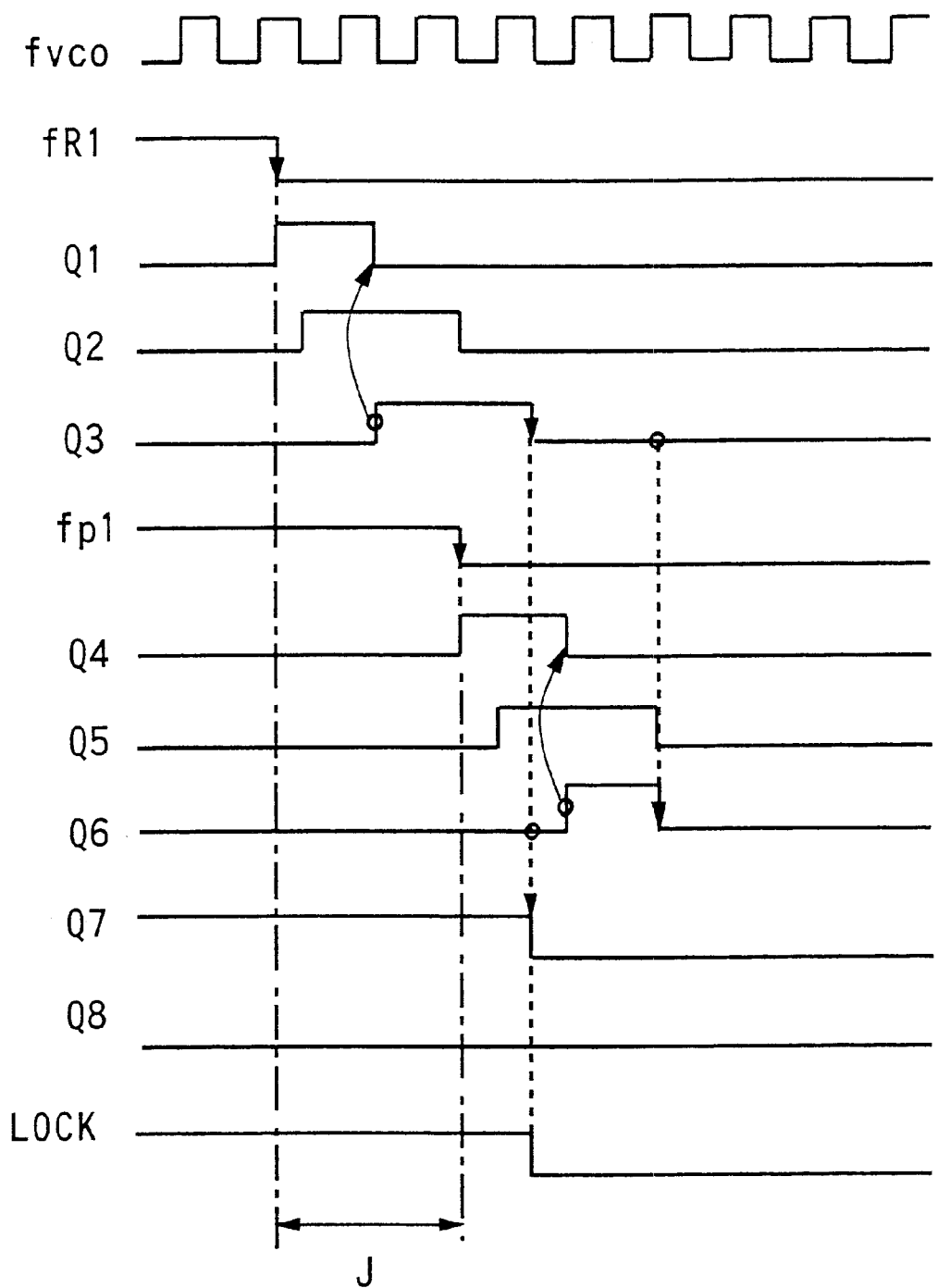
FIG. 18 shows another timing chart of a lock detecting circuit of the eighth embodiment.

Next, as shown in FIG. 18, when the signal LOCK is high level, the signal Q1 becomes high level at the fall of the signal fR1. Then, the signal Q2 becomes high level at the subsequent fall of the signal fvco. At this time, because the signal LOCK is high level, the multiplexer circuit 79 selects the signal Q2, and the signal Q3 becomes high level at the fall of the next signal fvco. The latch circuit 71 is reset when the signal Q3 becomes high level, and the signal Q1 becomes low level. The signal Q2 becomes low level at the fall of the next signal fvco. The signal Q3 becomes low level at the subsequent fall of the signal fvco. In this way, a signal Q3 is generated, having twice the cycle width of the signal fvco.

If the signal fp1 falls, the signal Q4 becomes high level. The signal Q5 then becomes high level at the rise of the next signal fvco. At this time, because the signal LOCK is high level, the multiplexer circuit 80 selects the signal Q5, and the signal Q6 becomes high level at the subsequent rise of the signal fvco. The latch circuit 72 is reset when the signal Q6 becomes high level, and the signal Q4 becomes low level. The signal Q5 becomes low level at the rise of the next signal fvco. At this time, because the signal LOCK is low level, the signal Q6 becomes low level. In this way, the signal Q6 is generated, which has the width of one cycle of the signal fvco. If the signal Q6 or the signal Q3 becomes high level because of the fall of the signal Q3 or signal Q6, the signal Q7 or the signal Q8 becomes high level, and the signal LOCK continues to be high level.

When the signal LOCK is high level, if the phase difference between the signal fR1 and the signal fp1 is less than two cycles of the signal fvco, it is judged that the frequency is locked. In this case, the high level signal LOCK continues as shown in the phase difference I in FIG. 17. If the phase difference between the signal fR1 and the signal fp1 is greater than two cycles of the signal fvco, it is judged that the frequency is unlocked, and the signal LOCK becomes low level as shown in the phase difference J in FIG. 18.

According to the eighth embodiment, it is judged that the frequency is locked when the frequency error is within a range of 100/N percent, and the lock detecting circuit outputs the high level signal LOCK. It is judged that the frequency is unlocked when the frequency error is greater than a range of 200/N percent, and the lock detecting circuit outputs the low level signal LOCK. Therefore, a stable lock detecting signal can be obtained.

The eighth embodiment has an advantage that the signal LOCK becomes easy to use as a control signal for peripheral circuits.

The RS latch circuit 5 is used to generate the signal fp1 in the first and second embodiments. A circuit such as flip-flop circuit can also be used for generating the signal fp1 in the first and the second embodiments.

Although the present invention has been described by way of exemplary embodiments, it should be understood that many changes and substitutions may be made by those skilled in the art without departing from the spirit and the scope of the present invention which is defined only by the appended claims.

What is claimed is:

1. A phase-locked loop circuit comprising:

a phase comparator having an output and first and second input terminals, a first frequency divided signal being input to the first input terminal of said phase comparator and a second frequency divided signal being input to the second input terminal thereof, said phase comparator comparing a phase of said first frequency divided signal with a phase of said second frequency divided signal, said first frequency divided signal being generated by dividing the frequency of a reference clock signal;

a low-pass filter having an output and an input coupled to the output of said phase comparator, said low-pass filter outputting a signal determined by the difference in phase between said first frequency divided signal and said second frequency divided signal;

a voltage controlled oscillator having an output terminal and an input coupled to the output of said low-pass filter, said voltage controlled oscillator generating at said output terminal an oscillator pulse signal having a frequency determined by the output of said low-pass filter;

a frequency dividing circuit including
  an N-ary counter, said N-ary counter having an output terminal, an input terminal coupled to the output terminal of said voltage controlled oscillator and a reset terminal; and
  a latch circuit, said latch circuit having an output coupled to the second input terminal of said phase comparator for inputting said second frequency divided signal thereto, a reset input pin coupled to the output terminal of said N-ary counter, and a set input pin coupled to the reset terminal of said N-ary counter; and a reset signal circuit for applying a set signal to the set input pin of said latch circuit and to the reset terminal of said N-ary counter for generating at the output of said latch circuit said second frequency dividing signal at a first level when a change in said oscillator pulse signal follows a change in said first frequency divided signal, and for initiating counting by said N-ary counter of a predetermined number of pulse of said oscillator pulse signal, the N-ary counter inputting a reset signal to the reset input pin of said latch circuit when said predetermined number of pulses have been counted, whereby said second frequency dividing signal changes from said first level to a second level.

2. A phase-locked loop circuit as claimed in claim 1, further comprising a lock detecting circuit which outputs a lock detecting signal when a phase difference between said first frequency divided signal and said second frequency divided signal falls within one clock cycle of the oscillator pulse signal generated by said voltage controlled oscillator.

3. A phase-locked loop circuit as claimed in claim 2, wherein said lock detecting circuit includes a first latch circuit, a second latch circuit, a third latch circuit, a fourth latch circuit, and a gate circuit, said first latch circuit storing a voltage of prescribed level in response to said first frequency divided signal and being reset in response to an output signal of said second latch circuit, said second latch circuit storing an output signal of said first latch circuit in response to the oscillator pulse signal of said voltage controlled oscillator, said third latch circuit storing a voltage of prescribed level in response to said second frequency divided signal and being reset in response to an output signal of said fourth latch circuit, said fourth latch circuit storing an output signal of said third latch circuit in response to the output signal of said voltage controlled oscillator, and said gate circuit outputting said lock signal as a result of an AND operation on the output signal of said second latch circuit and the output signal of said fourth latch circuit.

4. A phase-locked loop circuit as claimed in claim 2, wherein said lock detecting circuit includes a first latch circuit, a second latch circuit, a third latch circuit, a fourth latch circuit, a fifth latch circuit, a sixth latch circuit, and a gate circuit, said first latch circuit storing a voltage of prescribed level in response to said first frequency divided signal and being reset in response to an output signal of said second latch circuit, said second latch circuit storing an output signal of said first latch circuit in response to the oscillator pulse signal of said voltage controlled oscillator, said third latch circuit storing a voltage of prescribed level in response to said second frequency divided signal and being reset in response to an output signal of said fourth latch circuit, said fourth latch circuit storing an output signal of said third latch circuit in response to the oscillator signal of said voltage controlled oscillator, each of said fifth and sixth latch circuits storing an output signal of said fourth latch circuit in response to the output signal of said second latch circuit, and said gate circuit outputting said lock signal as a result of an OR operation on the output signal of said fifth latch circuit and the output signal of said sixth latch circuit.

5. A phase-locked loop circuit as claimed in claim 2, wherein said lock detecting circuit includes a first latch circuit, a second latch circuit, a third latch circuit, a fourth latch circuit, a fifth latch circuit, a sixth latch circuit, and a gate circuit, said first latch circuit storing a voltage of prescribed level in response to said first frequency divided signal and being reset in response to an output signal of said second latch circuit, said second latch circuit storing an output signal of said first latch circuit in response to the oscillator pulse signal of said voltage controlled oscillator, said third latch circuit storing a voltage of prescribed level in response to said second frequency divided signal and being reset in response to an output signal of said fourth latch circuit, said fourth latch circuit storing an output signal of said third latch circuit in response to the oscillator pulse signal of said voltage controlled oscillator, said fifth latch circuit storing an output signal of said second latch circuit in response to the output signal of said fourth latch circuit, said sixth latch circuit storing an output signal of said fourth latch circuit in response to the output signal of said second latch circuit, and said gate circuit outputting said lock signal as a result of an OR operation on the output signal of said fifth latch circuit and the output signal of said sixth latch circuit.

6. A phase-locked loop circuit as claimed in claim 2, wherein said lock detecting circuit includes a first latch circuit, a second latch circuit, a third latch circuit, a fourth latch circuit, a fifth latch circuit, a sixth latch circuit, a seventh latch circuit, an eighth latch circuit, a first multiplexer, a second multiplexer, and a gate circuit, said first latch circuit storing a voltage of prescribed level in response to said first frequency divided signal and being reset in response to an output signal of said fifth latch circuit, said second latch circuit storing an output signal of said first latch circuit in response to the oscillator pulse signal of said voltage controlled oscillator, said third latch circuit storing a voltage of prescribed level in response to said second frequency divided signal and being reset in response to an output signal of said sixth latch circuit, said fourth latch circuit storing an output signal of said third latch circuit in response to the oscillator pulse signal of said voltage controlled oscillator, said first multiplexer outputting an output signal of said first latch circuit or an output signal of said second latch circuit in response to a lock detecting signal, said second multiplexer outputting an output signal of said third latch circuit or an output signal of said fourth latch circuit in response to said lock detecting signal, said fifth latch circuit storing the output signal of said first multiplexer in response to the oscillator pulse signal of said voltage controlled oscillator, said sixth latch circuit storing the output signal of said second multiplexer in response to the oscillator pulse signal of said voltage controlled oscillator, said seventh latch circuit storing the output signal of said fifth latch circuit in response to the output signal of said sixth latch circuit, said eighth latch circuit storing the output signal of said sixth latch circuit in response to the output signal of said fifth latch circuit, and said gate circuit outputting said lock detecting signal which is a result of an OR operation on an output signal of said seventh latch circuit and an output signal of said eighth latch circuit.

7. A phase-locked loop circuit as claimed in claim 2, wherein said lock detecting circuit includes a first delay circuit, a second delay circuit, a first gate circuit, a second gate circuit, and a third gate circuit, said first delay circuit outputting a first signal which delays said first frequency divided signal, said second delay circuit outputting a second signal which delays said second frequency divided signal, said first gate circuit outputting a third signal which is a result of an AND operation on an inversion of said first frequency divided signal and said first signal, said second gate circuit outputting a fourth signal which is a result of an AND operation on an inversion of said second frequency divided signal and said second signal, and said third gate circuit outputting said lock detecting signal which is a result of an AND operation on said third and fourth signals.

8. A phase-locked loop circuit as claimed in claim 2, wherein said lock detecting circuit includes a first delay circuit, a second delay circuit, a first gate circuit, a second gate circuit, and a third gate circuit, a first latch circuit, and a second latch circuit, first delay circuit outputting a first signal which delays said first frequency divided signal, said second delay circuit outputting a second signal which delays said second frequency divided signal, said first gate circuit outputting a third signal which is a result of an AND operation on an inversion of said first frequency divided signal and said first signal, said second gate circuit outputting a fourth signal which is a result of an AND operation on an inversion of said second frequency divided signal and said second signal, said third gate circuit outputting a fifth signal which is a result of an AND operation of said third and fourth signals, said first latch circuit outputting a sixth signal of prescribed level in response to said third signal and being reset in response to said fifth signal, and said second latch circuit storing said sixth signal in response to said third signal and outputting said lock detecting signal.

9. A phase-locked loop circuit as claimed in claims 1 wherein said reset signal circuit comprises
- first latch circuit means for storing said first frequency dividing signal for a predetermined period of time and outputting a first signal upon receiving an oscillator pulse signal from said voltage controlled oscillator;
- second latch circuit means for storing said first signal for a predetermined period of time and outputting a second signal upon receiving the oscillator pulse signal from said voltage controlled oscillator; and
- first gate circuit means for adding said first signal and an inversion of said second signal, the output of said first gate circuit means being applied to the reset terminal of said N-ary counter and to the set input pin of said latch circuit.

10. A phase-locked loop circuit as claimed in claims 9 wherein said reset signal circuit further comprises third latch circuit means for dividing the frequency of the reference clock signal and outputting said first frequency dividing signal to said first latch circuit means and to said phase comparator.

11. A phase-locked loop circuit as claimed in claims 10 wherein said reset signal circuit further comprises a second gate circuit means for receiving the output of said first gate circuit means and the reset signal, the output of said first gate circuit means and the reset signal being coupled to the reset terminal of said N-ary counter by said second gate circuit means.

* * * * *